(12) United States Patent
Matsumoto et al.

(10) Patent No.: US 6,542,525 B1
(45) Date of Patent: Apr. 1, 2003

(54) LIGHT MODULATOR AND INTEGRATED SEMICONDUCTOR LASER-LIGHT MODULATOR

(75) Inventors: Keisuke Matsumoto, Tokyo (JP); Kazuhisa Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/511,249

(22) Filed: Feb. 23, 2000

(30) Foreign Application Priority Data

Sep. 20, 1999 (JP) ............................................. 11-265144

(51) Int. Cl.[7] .............................. H01S 3/10; H01S 5/00
(52) U.S. Cl. .............................. 372/26; 372/43; 372/44; 372/46; 372/50
(58) Field of Search ............................................. 372/26

(56) References Cited

U.S. PATENT DOCUMENTS 5,771,257 A * 6/1998 Takiguchi et al. ............. 372/50
5,978,402 A * 11/1999 Matsumoto et al. .......... 372/50

FOREIGN PATENT DOCUMENTS

JP          8172242          7/1996

* cited by examiner

*Primary Examiner*—Paul Ip
*Assistant Examiner*—Armando Rodriguez
(74) *Attorney, Agent, or Firm*—Leydig, Voit & Mayer, Ltd.

(57) ABSTRACT

A modulator and an integrated semiconductor modulator-laser device, in which the capacitance of the modulator is reduced to increase the cut-off frequency, and a manufacturing process for the device. A wire layer connecting a modulator electrode to a pad electrode is interposed between a first embedded layer of InP doped with Fe, extending from the modulator portion, between the insulating layer and the substrate. The wire layer has a capacitance smaller than when the first embedded layer is not beneath the insulating layer. The cut-off frequency of the modulator is increased, improving frequency characteristics. An integrated semiconductor modulator-laser device can include such a modulator.

10 Claims, 12 Drawing Sheets

12, SEMICONDUCTOR SUBSTRATE
32, INSULATING LAYER (SiO$_2$)
3, MODULATOR PORTION;
4b, PAD BASE
4, PAD PORTION
22, FIRST EMBEDDED LAYER
3a, MODULATOR ELECTRODE
5, CHANNEL PORTION
4a, PAD ELECTRODE
6, WIRE LAYER

12, SEMICONDUCTOR SUBSTRATE
32, INSULATING LAYER (SiO₂)
3, MODULATOR PORTION;
4b, PAD BASE
4, PAD PORTION

22, FIRST EMBEDDED LAYER
3a, MODULATOR ELECTRODE
5, CHANNEL PORTION
4a, PAD ELECTRODE
6, WIRE LAYER

16, BEAM ABSORPTION LAYER
24, HOLE-TRAPPING LAYER
26, SECOND EMBEDDED LAYER
20, BEAM WAVEGUIDE
27, CURRENT BLOCKING LAYER

62, ETCHING INHIBITING LAYER

72, CONTACT LAYER

82, MODULATOR PORTION
86, SEMICONDUCTOR LASER PORTION

92, ACTIVE LAYER

LIGHT MODULATOR AND INTEGRATED SEMICONDUCTOR LASER-LIGHT MODULATOR

BACKGROUND OF THE INVENTION

The present invention relates to a modulator and a modulator-integrated semiconductor laser device, and a Manufacturing Process therefor, for use in the optical communication. In particular, the present invention relates to the modulator and the modulator-integrated semiconductor laser device with an improvement in its modulating frequency characteristics by reducing a wire capacitance of the modulator, and the Manufacturing Process therefor.

In order to expand public communication web system with optical fibers, a semiconductor laser device and peripheral devices including a modulator should be improved in their characteristics and manufactured at a reasonable cost. Particularly, for a high-density communication with the optical devices, a modulator with a high modulation rate has been demanded to process a large amount of information. For this purpose, an external modulator has been widely used to modulate a laser beam continuously emitted from the semiconductor laser device in response to the electrical signals applied to the modulator. This is because the external modulator advantageously reduces the deviation of the laser beam wavelength, which might be caused in its modulation of the laser signal, allowing the beam signal to be transmitted over the long distance.

A reverse-biased electrical field is applied on the external modulator with a beam absorption layer. By this application, a beam absorption index of the beam absorption layer is changed according to the Franz-Keldysh effect or the Stark quantum confinement effect, so that the laser beam therethrough is absorbed more effectively. Thus, the laser beam can be switched on and off by the electrical signal applied to the modulator.

As described above, the higher density communication with the optical devices requires a higher modulation rate, which in turn requires an improved modulating frequency characteristics, i.e. an improved cut-off frequency. Basically, the modulating frequency characteristics depends upon its CR time constant which has parameters such as capacitance and resistance. Therefore, reduction should be made in the capacitance and/or the resistance of the modulator for the high-density optical communication.

Disadvantageously, the incorporation of the external modulator with the semiconductor laser device brings a difficulty in optical coupling between the semiconductor laser device and the modulator and results in an increase of the additional parts, making the device costly.

In order to overcome the problems, a modulator-integrated semiconductor laser device having a modulator monolithically integrated therewith on a common semiconductor substrate has been developed. However since the modulator-integrated semiconductor laser device has the frequency characteristics dependent on the CR time constant of the modulator, it is also critical to reduce the capacitance and/or resistance of the modulator for the high-density optical communication.

Specifically, descriptions will be made to the conventional modulator. Referring to FIGS. 11 and 12, the modulator 200 comprises a substrate 202 of n-type InP, a modulator portion 226, a pad portion 220, and a channel portion 228. In the following description, terminologies of "n-type" and "p-type" are referred to as "n-" and "p-", respectively.

As clearly shown in FIG. 12, the modulator portion 226 comprises a lower cladding layer 204, a beam absorption layer 206, and a first upper cladding layer 208, successively formed on the substrate 202. The modulator portion 226 also comprises a current blocking layer 210 including a first lower embedded layer 210a made of InP doped with Fe, a hole-trapping layer 210b made of n-InP, and a second upper embedded layer 210c made of InP doped with Fe. The modulator portion 226 further comprises a second cladding layer 212 made of InP and a contact layer 214 made of p-InGaAs.

The pad portion 220 comprises a multi-layered structure which is similar to that of the current blocking layer 210, the second upper cladding layer 212, the contact layer 214, and the insulating layer 216.

An insulating layer 216 is disposed on the modulator portion 226, the pad portion 220, and the channel portion 228, leaving an elongated opening above and opposing to the beam absorption layer 206.

A wire layer indicated by reference numerals 220a, 222, and 218 is disposed on the pad portion 220 and the channel portion 228, and in contact with the contact layer 214 through the opening, and a back electrode 224 is formed on the back surface of the substrate 202.

Referring again to FIG. 11, the operation of the modulator 200 is described hereinafter. In general, the modulator 200 receives a laser beam L1 as indicated in FIG. 11 at its couple-in facet and delivers a laser beam L2 at its couple-out facet. In this regard, the reverse-biased voltage is applied between the back electrode 224 and the modulator electrode 218 through the pad electrode 220a, which changes the beam absorption index of the reverse-biased beam absorption layer 206 due to the Franz-Keldysh effect or the Stark quantum confinement effect. While the reverse-biased voltage is turned off, the laser beam L2 can be delivered. But contrary to this, the reverse-biased beam absorption layer 16 absorbs the laser beam L1, and then prevents the laser beam L2 from being delivered. This provides the ON-OFF switching of the laser beam L2 generating a high-rate modulating electrical signal. In this manner, the electrical signal can be transformed into the laser beam signal in the form of pulses.

As described above, the cut-off frequency of the modulator 200 depends upon the CR time constant. Then, in order to achieve a high-rate modulator for the high-density signal communication, the CR time constant, that is, the capacitance and/or the resistance of the modulator 200 should be reduced.

It should be noted that the capacitance of the modulator 200 equals to the sum of the capacitance of the modulator portion 226, the pad portion 220, and the channel portion 228. Disadvantageously, each of the capacitances of the modulator portion 226, the pad portion 220, and the channel portion 228 can not be readily reduced due to the structural reasons, which will be described below. Therefore, the present invention addresses to the reduction of the capacitance, especially of the channel portion 228 and the modulator portion 226, thereby increasing the cut-off frequency for the high-density optical communication.

JP8-172242, A, discloses an another conventional semiconductor laser device. The semiconductor laser device comprises a pad portion formed on the common substrate having the same layer structure as that of an active layer (the light emitting and waveguiding layer), and a wire layer formed on an insulating layer connecting an anode electrode of the active layer with a bonding pad. However, it fails to describe the layer structure beneath the insulating layer.

Also, JP6-216464, discloses an another example of a conventional field-absorption type modulator, in which a polyimide layer is deposited on the common substrate and adjacent to the ridge-like modulator. In this structure, although a buffer layer made of undoped InP is deposited beneath the modulator and the polyimide layer, no description is made to a channel for dividing the modulator from the polyimide layer.

Examples of a manufacturing process using an etching-inhibiting layer to form a beam waveguide structure are JP11-97799, A, JP11-87836, A, and JP7-231145, A.

SUMMARY OF THE INVENTION

A first object of the present invention is to provide a modulator in which its capacitance is reduced to increase the cut-off frequency and thereby to improve the frequency-characteristics.

A second object of the present invention is to provide a modulator-integrated laser device integrating a modulator therein, in which its capacitance is reduced to increase the cut-off frequency and thereby to improve the frequency-characteristics.

A third object of the present invention is to provide a process for manufacturing the modulator and the modulator-integrated semiconductor laser device integrating the modulator, in which its capacitance is reduced to increase the cut-off frequency and thereby to improve the frequency-characteristics.

The modulator according to the present invention comprises: a) a semiconductor substrate; b) a ridge-like modulator structure formed on the semiconductor substrate for modulating a laser beam, the modulator structure including, a ridge-like beam waveguide, a current blocking layer disposed on opposite sides of the beam waveguide and the substrate, the current blocking layer having a first semi-insulating semiconductor layer and a first semiconductor layer successively formed on the substrate, and c) a pad structure formed on the semiconductor substrate and spaced away from the modulator structure via a channel portion, for providing a wire-bonding pad base; d) the channel portion including the first semi-insulating semiconductor layer extending from the modulator structure; e) an insulating layer extending on the modulator structure, the pad structure, and the channel portion, the insulating layer having an opening on the modulator structure; and f) a wire layer disposed on said insulating layer, said wire layer being in contact with said modulator structure through the opening, wherein the capacitance of the channel portion is reduced since not only the insulating layer but also the first semi-insulating semiconductor layer are formed beneath the wire layer.

In the modulator of the present invention, the current blocking layer further has a second semi-insulating semiconductor layer formed on the first semiconductor layer.

Further in the modulator of the present invention, the pad structure includes a layer structure same as that of the current blocking layer, so that the pad structure can be formed readily, and simultaneously as the current blocking layer.

And the modulator according to the present invention further comprises: a second semiconductor layer interposed between the first semi-insulating semiconductor layer and the first semiconductor layer, wherein the second semiconductor layer being etched more slowly than the first semiconductor layer, so that the second semiconductor layer functioning as an etching-inhibiting layer readily removes the first semiconductor thoroughly by etching.

In the modulator of the present invention, the modulator structure includes a stripe-like contact layer connected to the wire layer, the contact layer having an width narrower than that of the ridge-like modulator structure, wherein the capacitance of the modulator portion is reduced.

Also, the modulator-integrated semiconductor laser device according to the present invention comprises: a) a semiconductor substrate; b) a ridge-like modulator structure formed on the semiconductor substrate for modulating a laser beam, the modulator portion including, a ridge-like beam waveguide, and a current blocking layer disposed on opposite sides of the beam waveguide and the substrate, the current blocking layer having a first semi-insulating semiconductor layer and a first semiconductor layer successively formed on the substrate; c) a pad structure formed on the semiconductor substrate and spaced away from the modulator structure via a channel portion, for providing a wire-bonding pad base; d) the channel portion including the first semi-insulating semiconductor layer extending from the modulator structure; e) an insulating layer disposed on the modulator structure, the pad structure, and the channel portion with an opening on the modulator structure; f) a wire layer disposed above the pad structure and the channel portion via the insulating layer and in contact with the modulator structure through the opening; and g) a semiconductor laser structure disposed on the substrate and adjacent to the modulator structure in a longitudinal direction thereof, the semiconductor laser structure including an active layer optically connected to the beam absorption layer, wherein the capacitance of the channel portion is reduced since not only the insulating layer but also the first semi-insulating semiconductor layer are formed beneath the wire layer.

In the modulator-integrated semiconductor laser device of the present invention, the current blocking layer further has a second semi-insulating semiconductor layer formed on the first semiconductor layer.

And, in the modulator-integrated semiconductor laser device of the present invention, the pad structure includes a layer structure same as that of the current blocking layer, so that the pad structure can be formed readily, and simultaneously as the current blocking layer.

And the modulator-integrated semiconductor laser device according to the present invention further comprises: a second semiconductor layer interposed between the first semi-insulating semiconductor layer and the first semiconductor layer, wherein the second semiconductor layer being etched more slowly than the first semiconductor layer, so that the second semiconductor layer functioning as an etching-inhibiting layer readily removes the first semiconductor thoroughly by etching.

In the modulator-integrated semiconductor laser device of the present invention, the modulator structure includes a stripe-like contact layer connected to the wire layer, the contact layer having an width narrower than that of the ridge-like modulator structure, wherein the capacitance of the modulator portion is reduced.

Furthermore, A process for manufacturing a modulator of the present invention, comprises: a) a first step for growing a lower cladding layer, a beam absorption layer, and an upper cladding layer on a semiconductor substrate, and etching the resultant layers with a first stripe-like mask until the substrate is exposed to form a ridge-like waveguide; b) a second step for growing a first semi-insulating semiconductor layer and a first semiconductor layer successively with the first mask on opposite sides of the beam waveguide and the substrate to form a current blocking layer; c) a third step for removing the stripe-like dielectric layer; d) a fourth step for etching the resultant layers with a second stripe-like mask covering, in part, the ridge-like waveguide and the current blocking layer adjacent to the sides of the waveguide until the first semi-insulating semiconductor layer is exposed to form a ridge-like modulator structure and a pad structure; e) a fifth step for forming an insulating layer with an opening above the waveguide; and f) a sixth step for forming a wire layer on the insulating layer and in contact with the modulator structure through the opening, whereby the modulator with the reduced capacitance of the channel portion is readily formed since not only the insulating layer but also the first semi-insulating semiconductor layer are formed beneath the wire layer.

In the process of the present invention, the second step including a sub-step for growing a second semi-insulating semiconductor layer with the first mask on the first semiconductor layer after growing the first semiconductor layer, whereby the modulator with the improved cut-off frequency can be readily formed.

Also, a process for manufacturing a modulator-integrated laser device, comprising: a) a first step for growing a lower cladding layer, a beam absorption layer, and an upper cladding layer on a semiconductor substrate, and etching the resultant layers with a first stripe-like mask until the substrate is exposed to form a ridge-like waveguide; b) a second step for growing a first semi-insulating semiconductor layer and a first semiconductor layer successively with the first mask on opposite sides of the beam waveguide and the substrate to form a current blocking layer; c) a third step for removing the stripe-like dielectric layer; d) a fourth step for etching the resultant layers with a second stripe-like mask covering, in part, the ridge-like waveguide and the current blocking layer adjacent to the sides of the waveguide until the first semi-insulating semiconductor layer is exposed to form a ridge-like modulator structure and a pad structure; e) a fifth step for forming an insulating layer with an opening above the waveguide; f) a sixth step for forming a wire layer on the insulating layer and in contact with the modulator structure through the opening; and g) a seventh step for forming a semiconductor laser on the semiconductor substrate and adjacent to the modulator structure in a longitudinal direction thereof, the semiconductor laser structure including an active layer optically connected to the beam absorption layer, whereby the modulator with the reduced capacitance of the channel portion is readily formed since not only the insulating layer but also the first semi-insulating semiconductor layer are formed beneath the wire layer.

In the process of the present invention, the second step including a sub-step for growing a second semi-insulating semiconductor layer with the first mask on the first semiconductor layer after growing the first semiconductor layer, whereby the modulator with the improved cut-off frequency can be readily formed.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

DETAILED DESCRIPTION OF THE PREFERRED EMBODIMENTS

Embodiment 1

A field-absorption type external modulator with a modulation rate of 10 Gb/s, for use of a trunk communication line, by a way of one example, is described hereinafter.

The external modulator according to the first embodiment, in general, comprises a modulator portion, a pad portion, and a channel portion isolating the modulator portion from the pad portion thereof. Also, the external modulator is characterized in that the channel portion has a depth so that it runs through a hole-trapping layer to a first bedding layer, reducing the capacity of a wire layer deposited on the channel portion.

Figure 1:
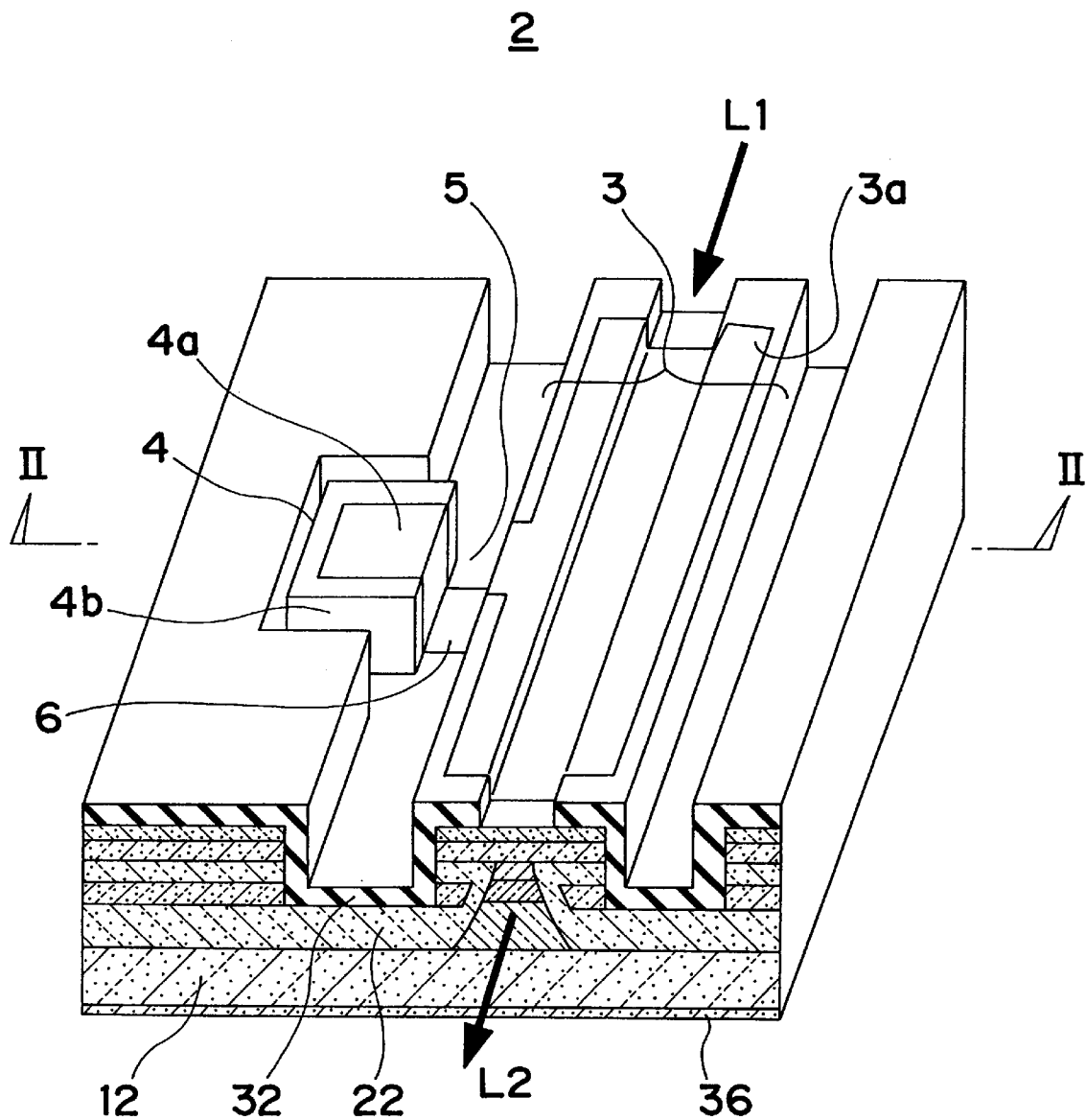
FIG. 1 is a schematic perspective view of the modulator of the present invention.
Figure 2:
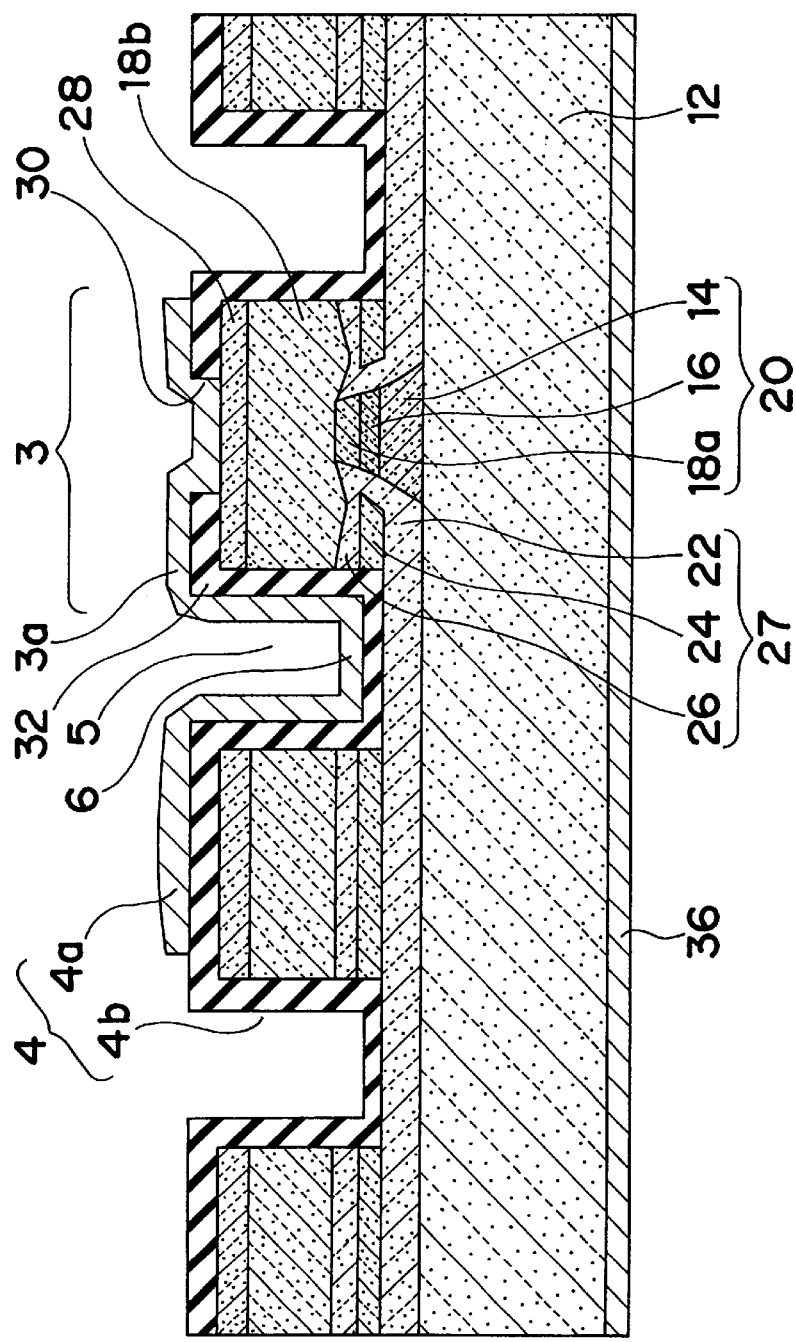
FIG. 2 is a schematic cross-sectional view taken along lines II—II of FIG. 1.

FIGS. 1 and 2 show a modulator 2 having a modulator portion 3 and a pad portion 4. The modulator portion 3 has a ridge-like shape extending in its longitudinal direction, on which a modulator electrode 3a is located. The pad portion 4 includes a pad base 4b and a pad electrode 4a thereon.

The modulator portion 3 has a width of approximately 10 though 20 $\mu$m in the plane perpendicular to the longitudinal direction such that the modulator portion 3 confines the laser beam therein sufficiently and can be readily manufactured.

A top surface of the pad base 4b has an area of 30 through 50 $\mu m^2$. The pad electrode 4a has substantially the same area as the top surface of the pad base 4b.

In order to prevent the modulator portion 3 from being damaged when the wire is bonded on the electrode potion 4, it is essential to have the modulator portion 3 spaced away to some extent from the pad portion 4. In particular, the modulator portion 3 is apart from the pad portion 4 via the longitudinal channel portion 5 with a width of 15 though 30 $\mu$m, so that the wire bonding position is far away from the modulator portion 3 by about 50 $\mu$m or more.

The modulator electrode 3a formed on the modulator portion 3 is connected to the pad electrode 4a formed on the pad portion 4 via a wire layer 6 formed on the channel portion 5.

Referring again to FIG. 2, formed on a substrate 12 made of n-InP is a lower cladding layer 14 made of p-InP. Further, deposited on the lower cladding layer 14 is a beam absorption layer 16 made of undoped InGaAsP. The present beam absorption layer 16 is constituted of an n-side beam confinement layer of n-InGaAsP, a MQW layer of InGaAsP, and a p-side beam confinement layer of p-InGaAsP. Further, formed on the beam absorption layer 16 is a first upper cladding layer 18a made of InP. The lower cladding layer 14, the beam absorption layer 16, and the first upper cladding layer 18a, each having a stripe-like configuration in the longitudinal direction, constitute a beam waveguide 20 with a ridge-like configuration having a width of 1 through 2 μm and a height of 2 through 3 μm.

A first embedded layer 22 made of first semi-insulating semiconductor material such as InP doped with Fe is deposited not only on the sides of the beam waveguide 20, but also on an upper major surface of the substrate 12. Deposited on the first embedded layer 22 is a hole-trapping layer 24 made of first semiconductor material such as n-InP, on which a second embedded layer 26 made of second semi-insulating semiconductor material such as InP doped with Fe is deposited. The first and second embedded layers 24, 26 are connected each other adjacent to the beam waveguide 20. The first embedded layer 22, the hole-trapping layer 24, and the second embedded layer 26 constitute a current-blocking layer 27.

Deposited on the beam waveguide 20 and the current blocking layer 27 is a second cladding layer 18b made of p-InP and a contact layer 28 made of p-InGaAs, in this order.

A pair of channel portions 5 with a depth beyond the hole-trapping layer 24 and up to the first embedded layer 22 is formed longitudinally along the beam waveguide 20 and the current blocking layer 27 to form a ridge-like modulator, centering the beam waveguide 20 therein.

An insulating layer 32 of SiO$_2$ is laminated on the modulator structure, leaving an elongated opening above and opposing to the beam waveguide 20. Lastly, a modulator electrode 3a is deposited on the contact layer 28 through the opening to complete the modulator portion 3, in which a width of the modulator portion 3 perpendicular to the longitudinal direction of the beam waveguide 20 is about 10 to 20 μm.

The pad portion 4, on the other hand, includes a pad structure having the same layer material structure simultaneously formed on the first embedded layer 22 as the modulator structure, i.e., the current blocking layer 27, the second upper cladding layer 18b, and the contact layer 28. Similarly, the pad portion 4 has an insulating layer 32 of SiO$_2$ laminated thereon. The channel portion 5 formed between the pad portion 4 and the modulator portion 3 separates the hole-trapping layer 24. Also, the pad portion 4 has a pad electrode 4a formed thereon, which is electrically connected to the modulator electrode 3 via the wire layer 6 deposited on the channel portion therebetween.

The modulator has a back electrode 36 formed on the lower major surface of the substrate 12.

Referring now to FIGS. 3 and 4, the manufacturing process of the modulator 2 is described hereinafter.

By an epitaxial crystal growth, the lower cladding layer 14 of n-InP, the beam absorption layer 16 of undoped InGaAsP, and the first upper cladding layer 18a of p-InP are deposited in this order on the substrate 12. A dielectric layer 40 in the form of elongated ridge is formed on the first upper cladding layer 18a having a width of 6 to 7 μm.

Figure 3A:
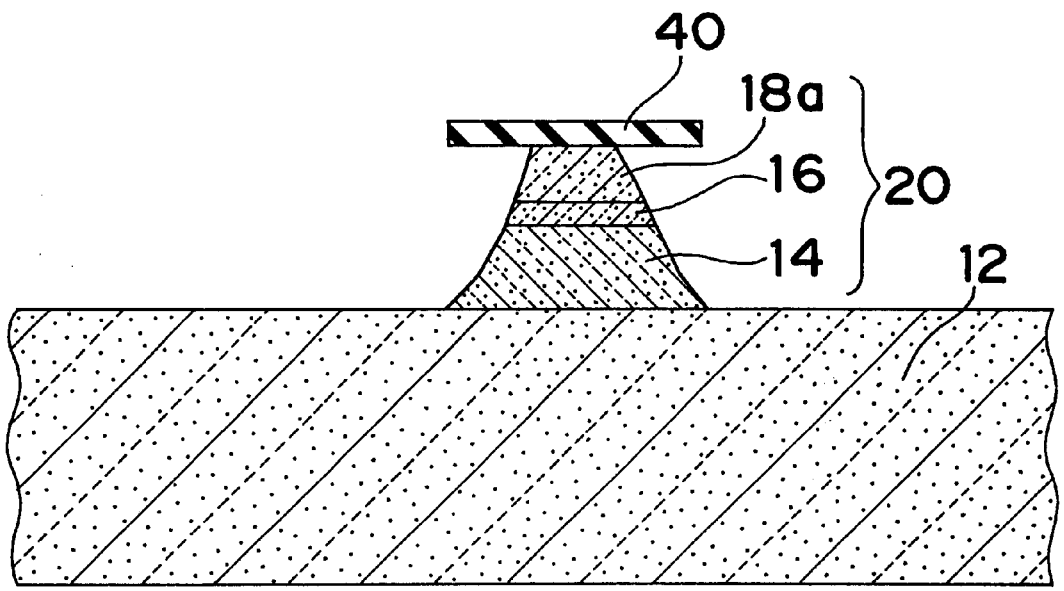
FIGS. 3A and 3B are schematic perspective views of the process for manufacturing the modulator of the present invention.

The use of the HBr based etchant and the dielectric layer 40 as a mask allows a beam waveguide 20 wet-etched to have a ridge configuration, having the width of about 1 to 2 μm and the height of about 3 to 4 μm, as shown in FIG. 3A. Alternatively, the methane based etchant may be used for dry-etching.

Figure 3B:
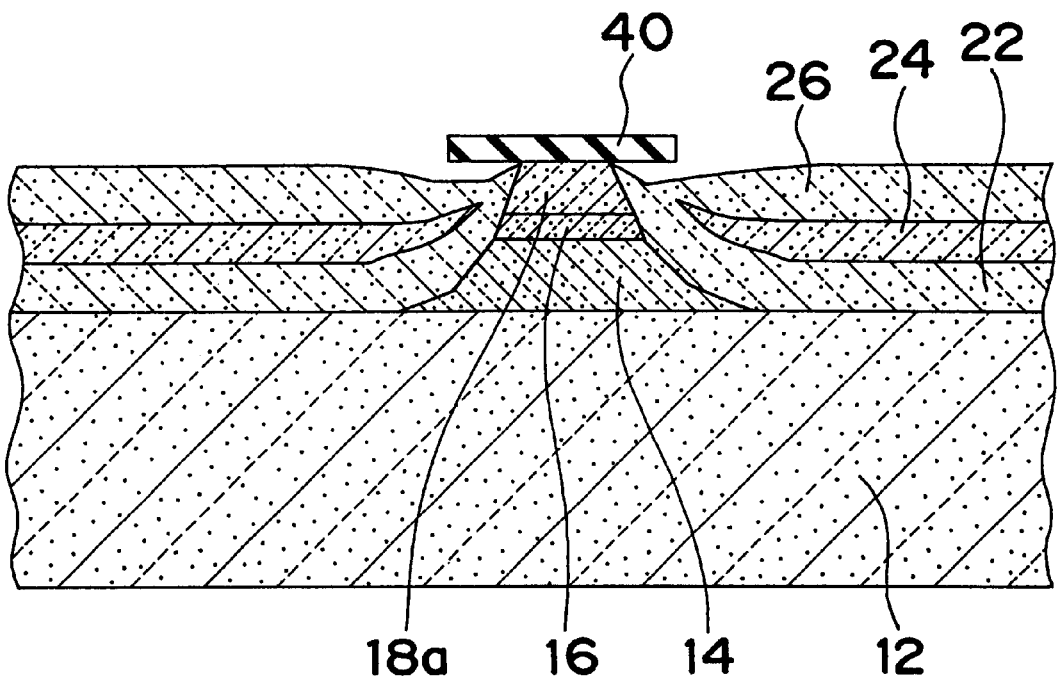

With the use of the dielectric layer 40 as a mask again, the first embedded layer 22 of InP doped with Fe, the hole-trapping layer 24 of n-InP, and the second embedded layer 26 of InP doped with Fe are deposited in this order on the sides of the beam waveguide 20 as well as on the substrate 12. Since the hole-trapping layer 24 beneath the dielectric layer 40 is prevented from growing, the first and second embedded layers are connected at the portions adjacent to the beam waveguide 20, as shown in FIG. 3B.

Figure 4A:
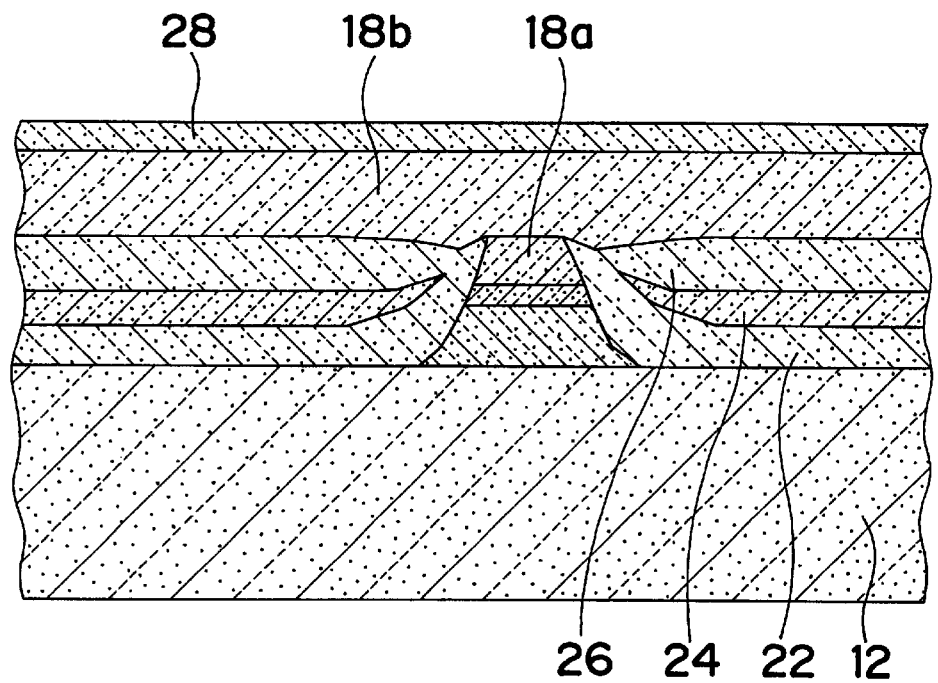
FIGS. 4A and 4B are schematic perspective views of the process for manufacturing the modulator of the present invention.

After removing the dielectric layer 40, the second upper cladding layer 18b of p-InP and the contact layer 28 of p-InGaAs are successively deposited by the epitaxial crystal growth on the second embedded layer 26 and the first upper cladding layer 18a, as shown in FIG. 4A.

Figure 4B:
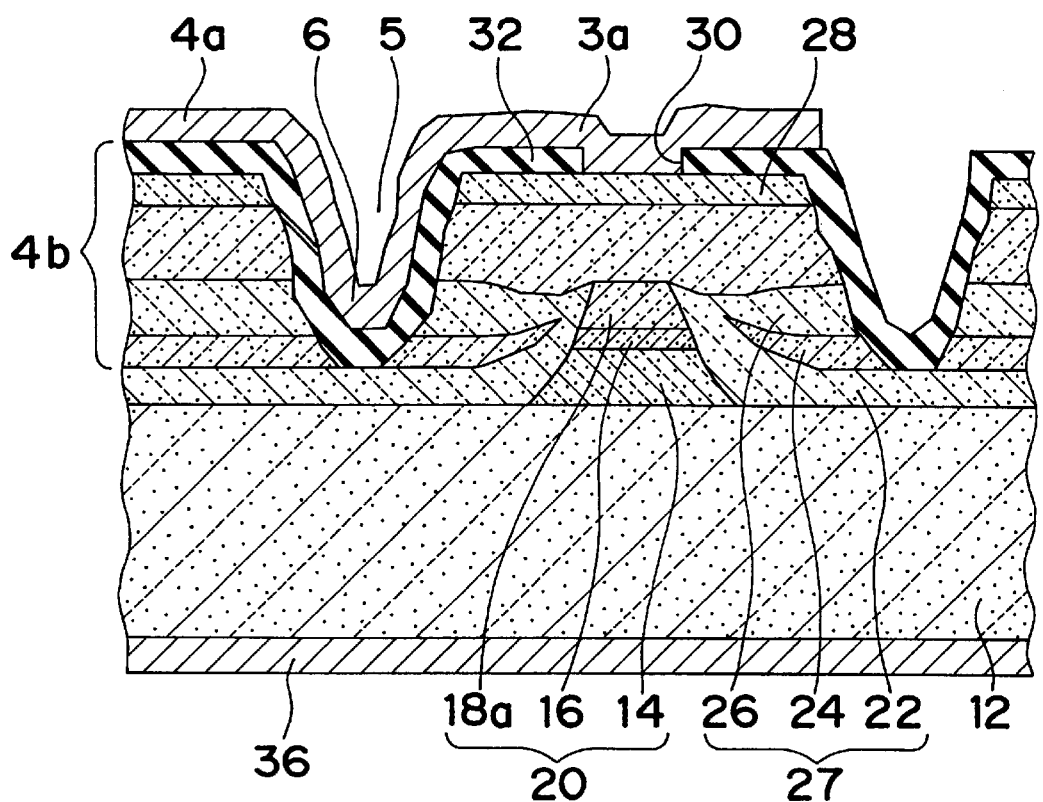

Then, in a photolithography and etching step, the pair of channel portions 5 is etched to form the modulator structure with the ridge configuration, centering the beam waveguide 20 therein. The etching of the channel portions 5 is controlled to extend through the hole-trapping layer 24 and terminate at the first embedded layer 22, as shown in FIG. 4B. At the same time, an another channel portion (not shown) surrounding the pad portion 4 is etched to form the pad base 4b. In the preferred embodiment of the present invention, the channel portions may be etched either by wet-etching with the Br-methanol based etchant, or alternatively by dry-etching with the methane based etchant.

In an another photolithography and etching step, the insulating layer 32 made of material such as SiO$_2$ is formed entirely on the resultant layer structure with the opening 30 above and opposing to the beam waveguide 20.

The pad electrode 4a is formed on the insulating layer 32 above the pad base 4b. Also, the modulator electrode 3a is formed on the insulating layer 32 above the modulator structure and connected to the contact layer 28 through the opening 30, thereby to complete the modulator portion 3. Further, the wire layer 6 laminated on the channel portion 5 connects with the modulator electrode 3a and the pad electrode 4a. Lastly, the lower major surface of the substrate 12 is ground so that the substrate 12 has a thickness of approximately 100 μm, then a back electrode 36 is deposited on the lower major surface, as shown in FIG. 4B.

Referring again to FIG. 1, the operation of the modulator 2 is described hereinafter. In general, the modulator 2 receives a laser beam L1 at its couple-in facet, and delivers a laser beam L2 at its couple-out facet as indicated in FIG. 1. The reverse-biased voltage is applied between the modulator electrode 3a through the pad electrode 4a and the back electrode 36 to have the beam absorption layer 16 reverse-biased, so that the beam absorption index is increased according to the Franz-Keldysh effect or the Stark quantum confinement effect. Thus, the ON-signal of the reverse-biased voltage allows the laser beam L2 to be absorbed within and not delivered from the modulator 2. Contrary to this, turning off the signal of the reverse-biased voltage (no signal) permits the laser beam L2 transmitting therethrough. This provides the ON-OFF switching of the laser beam according to the reverse-biased voltage, which can be a high-rate modulating electrical signal. Thus, the electrical signal can transform the laser beam signal.

In principle, the cut-off frequency of the modulator 2 is dependent upon its CR time constant varied with parameters of its capacitance and resistance. In order to achieve a high-rate modulation for the high-density signal communication, the CR time constant, that is, the capacitance and/or the resistance of the modulator 2 should be reduced.

Focusing on the capacitance of the modulator 2, which equals to the sum of the capacitance of the modulator portion 3, the pad portion 4, and the channel portion 5. The capacitance of the modulator portion 3 depends on the area of the modulator portion 3, in particular, the contact layer 28 thereof, which is generally defined by the longitudinal length and the width perpendicular the length thereof. The width is such that the laser beam is well confined within the modulator portion 3 and a simple step for producing thereof is assured, and the length is such that the laser beam is enough absorbed therein. The capacitance of the pad portion 4 depends on the area of the pad portion 4, which is wide enough for a bonding-wire to be bonded thereon. The capacitance of the channel portion 5 depends on the thickness of the first embedded layer 22 and the insulating layer 32, as well as the area of the wire layer 6. The wire area is defined by the wire width and the wire length between the modulator portion 3 and the pad portion 4 which is far enough for preventing the modulator portion 3 from being damaged by wire-bonding on the pad portion 4. The capacitance of the modulator 2 is less than as would be unless the channel portion 5 divides the modulator portion 3 and the pad portion 4, since the contact layer 28 expands up to the pad portion 4.

In the preferred embodiment of the present embodiment, the channel portion 5 has the depth beyond the hole-trapping layer 24 and up to the first embedded layer 22. Thus, the capacitance of the channel portion 5 has its dielectric layer having a total thickness of the insulating layer 32 and the first embedded semi-insulating semiconductor layer 22, which is thicker than the total thickness without the first embedded layer 22 according to the prior art thereby to reduce the capacitance of the channel portion 5. The reduced capacitance of the channel portion 5 and the capacitance of the modulator 2 in turn increases the cut-off frequency of the modulator 2, so that the higher-density signal communication can be achieved. In addition, the capacitance of the channel portion 5 may be reduced by narrowing the wire width of the wire layer 6.

In order to confirm that the capacitance of the modulator 2 is reduced by controlling the depth of the channel portion 5 as described above, an example of an experimental data is shown hereinafter.

In the case where the pad electrode 4a has the area of 50×50 $\mu$m, the wire layer 6 has the wire length of 15 $\mu$m, and the thickness of the first embedded layer 22 is 2.5 $\mu$m;

1) the capacitance per 1 $\mu m^2$ of the pad portion 4 is 0.025 fF/$\mu m^2$,
2) the capacitance per 1 $\mu m^2$ of the channel portion 5 without the first embedded layer 22 is 0.087 fF/$\mu m^2$, and
3) the capacitance per 1 $\mu m^2$ of the channel portion 5 with the first embedded layer 22 is 0.042 fF/$\mu m^2$, wherein fF means the femto ($10^{-5}$) Farad.

As can be seen clearly, the capacitance per 1 $\mu m^2$ of the channel portion 5 with the first embedded layer 22 is reduced to half of that in case where the first embedded layer 22 is eliminated. Eventually, the capacitance of the modulator 2 which used to be 539 fF in total can be reduced to 519 fF with the first embedded layer 22 so that the cut-off frequency can be increased from 11.8 GHz to 12.3 GHz thereby to realize the high-density signal communication.

Modification 1

Figure 5:
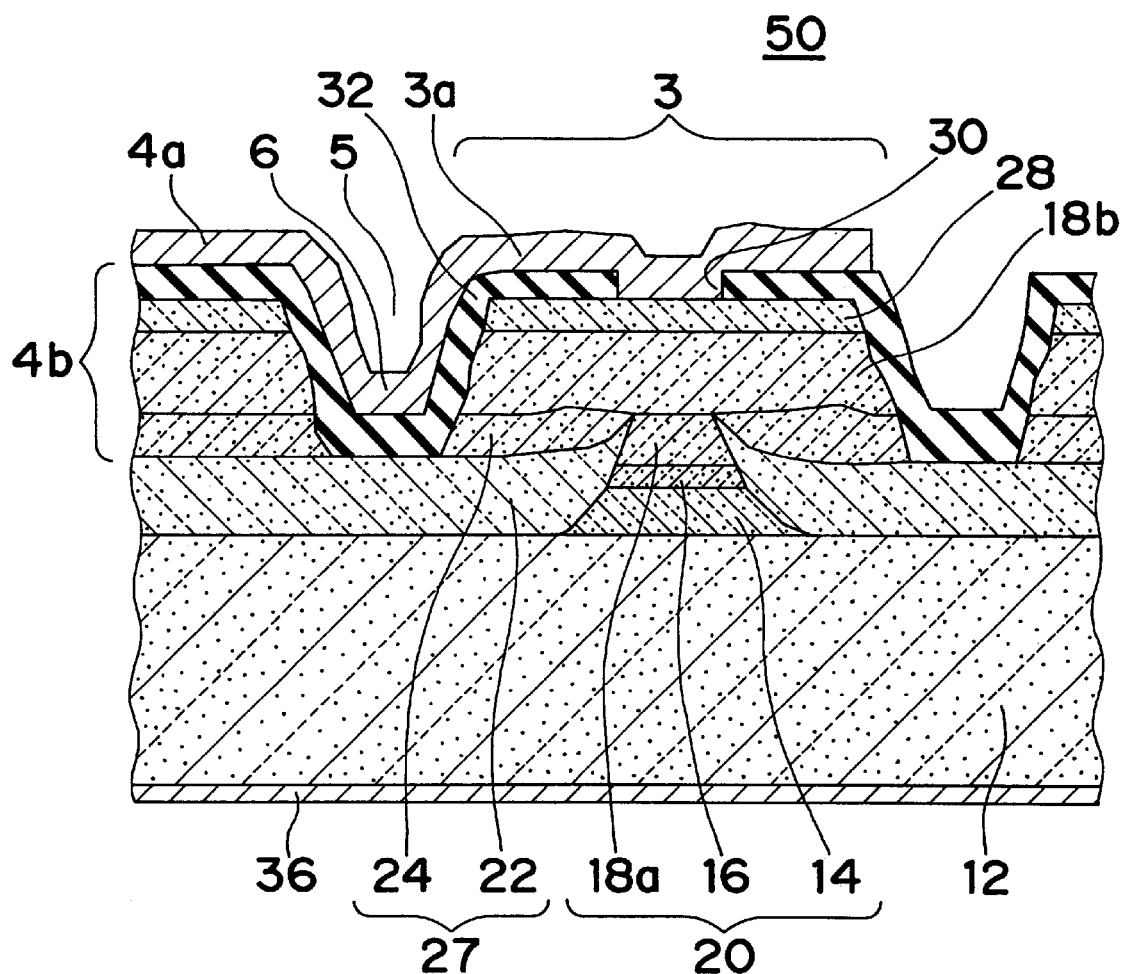
FIGS. 5 through 7 are schematic cross-sectional view of a part of the modulator of the present invention.

Referring to FIG. 5, an example of modifications of the present invention is described hereinafter. The modulator 50 of the present modification has substantially the same structure as that of Embodiment 1 except that the second embedded layer is eliminated. The like reference numerals as Embodiment 1 are used for the like components as indicated in FIG. 5. Therefore, no further description will be made thereto. With the arrangement, the modulator 50 without the second embedded layer 26 simplifies the process for manufacturing thereof.

According to an another modification of the present invention, the pad base 4b may be formed with insulating material such as polyimide rather than the same layer structure as the modulator portion 3. Also, the pad base 4b is made of polyimide, the capacitance of the pad portion 4 can be expected to be further reduced. Meanwhile the pad base 4b has the same structure as described in Embodiment 1 or in the previous modification, the modulator 2 can be produced economically.

Embodiment 2

Figure 6:
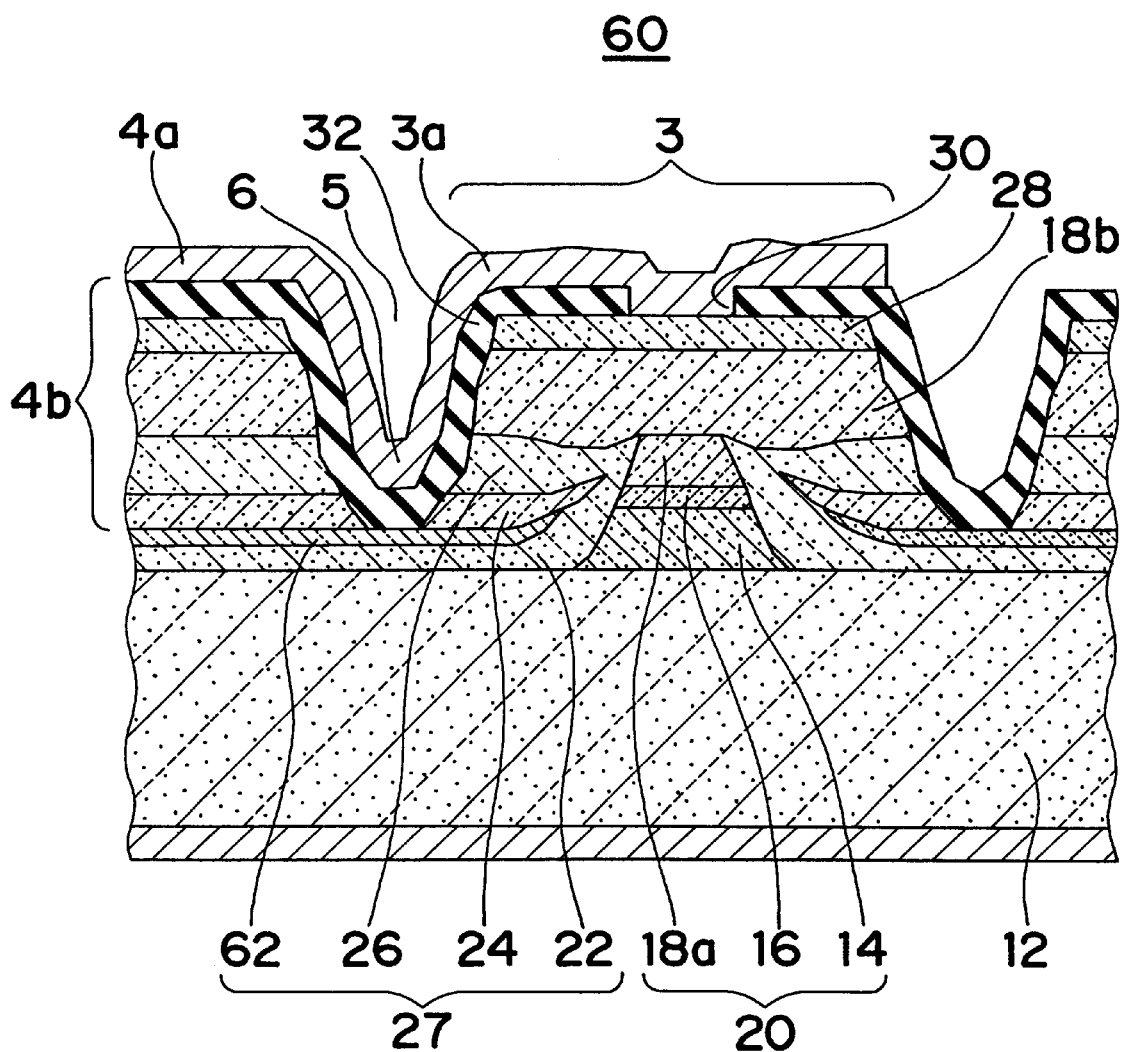

Referring now to FIG. 6, a second embodiment of the present invention is described hereinafter. The modulator 60 of Embodiment 2 has substantially the same structure as Embodiment 1 except that an etching-inhibiting layer 62 is further provided under the hole-trapping layer 28. The like reference numerals as Embodiment 1 are used for the like components as indicated in FIG. 6. Therefore, no further description will be made thereto.

The etching-inhibiting layer 62 is interposed between and in contact with the first embedded layer 22 and the hole-trapping layer 24. Preferably, the etching-inhibiting layer 62 has a thickness of approximately 0.05 to 0.1 $\mu$m. The material of the etching-inhibiting layer 62 may be chosen according to the etching process for forming the channel portion 5. For example, InGaAsP may be used for the selective wet-etching and InAlAs may be used for the dry-etching.

The manufacturing process of the modulator 60 according to Embodiment 2 is also similar to that according to Embodiment 1 except that an another step for depositing the etching-inhibiting layer 62 is required. Therefore no further description will be made thereto.

In the preferred embodiment of the process, various steps as discussed according to Embodiment 1 are performed. One additional step for depositing the etching-inhibiting layer 62 using material suitable for the etching process as described above is performed after forming the first embedded layer 22 and before forming the hole-trapping layer 24.

By providing the etching-inhibiting layer 62 between the first embedded layer 22 and the hole-trapping layer 24, the hole-trapping layer 24 in the channel portion 5 can be completely removed to assure that the first embedded layer 22 has a constant thickness. This reduces the deviation of the capacitance of the channel portion 5 and also the deviation of the cut-off frequency among the products of the modulator 60.

The modulator 60 may be modified so that it does not have the second embedded layer 26, which also results in the same effect as discussed in Modification 1.

Although the etching-inhibiting layer 62 is provided in order to remove hole-trapping layer 24 thoroughly, in addition to that, the combination of different material of the hole-trapping layer 24 and another etchant can results in the same effect as described above. The hole-trapping layer 24 made of n-InGaAsP can be selectively etched away with the etchant of tartaric acid and hydrogen peroxide, alternatively, the hole-trapping layer 24 made of n-InAlAs can be selectively etched away with the etchant of nitric acid.

Embodiment 3

Figure 7:
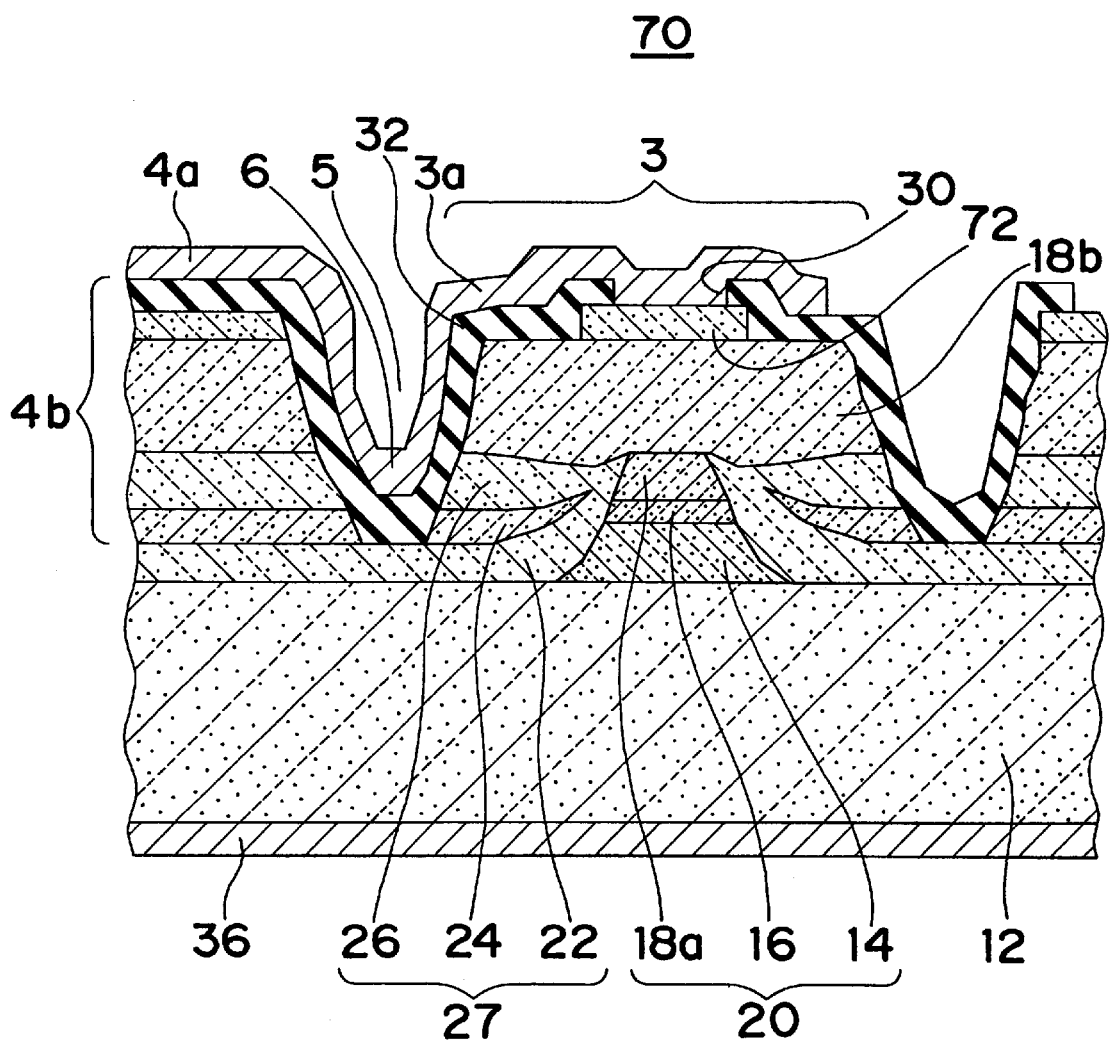

Referring now to FIG. 7, a third embodiment of the present invention is described hereinafter. The modulator 70 of the Embodiment 3 has substantially the same structure as Embodiment 1 except that the contact layer 72 formed above and opposing to the beam waveguide 20 has a width narrower than that of Embodiments 1 and 2. The like reference numerals as Embodiment 1 are used for the like components as indicated in FIG. 7. Therefore no further description will be made thereto.

In FIG. 7, the contact layer 72 has the width of approximate 3 to 6 μm, and the second cladding layer 18b has the width of approximate 10 to 20 μm.

The manufacturing process of the modulator 70 according to Embodiment 3 is also similar to that according to Embodiment 1 except that an another photolithography and etching step is required after the step shown in FIG. 4A for forming the contact layer 72 narrower than the second cladding layer 18b. Therefore, no further description will be made thereto.

The contact layer 72 may be formed by depositing the p-InGaAs layer which may originally have a width narrower than that of Embodiment 1, or alternatively, by depositing the p-InGaAs layer which originally has substantially the same width as the second cladding layer 18b and may be etched thereafter.

As described above, the capacitance of the modulator portion 3 is dependent on the area of the modulator portion 3, in particular, of the contact layer 72 thereof. A narrower electrode plate of a capacitor, in general, decreases its capacitance. The contact layer 72 of Embodiment 3, which is narrower than that of Embodiment 1 reduces the capacitance of the modulator portion 3 as well.

Embodiment 4

Figure 8:
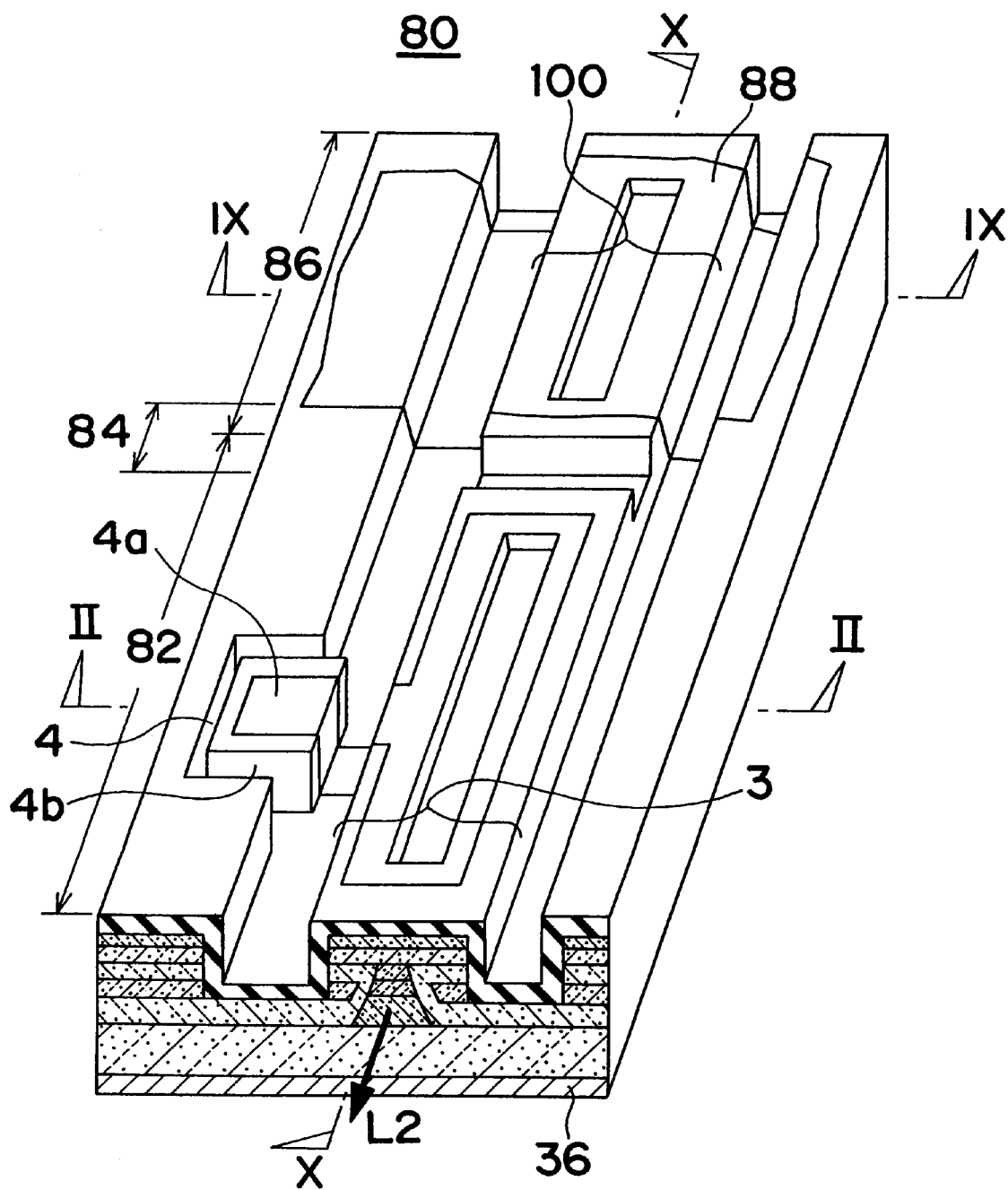
FIG. 8 is a schematic perspective view of the modulator-integrated semiconductor laser device of the present invention.
Figure 9:
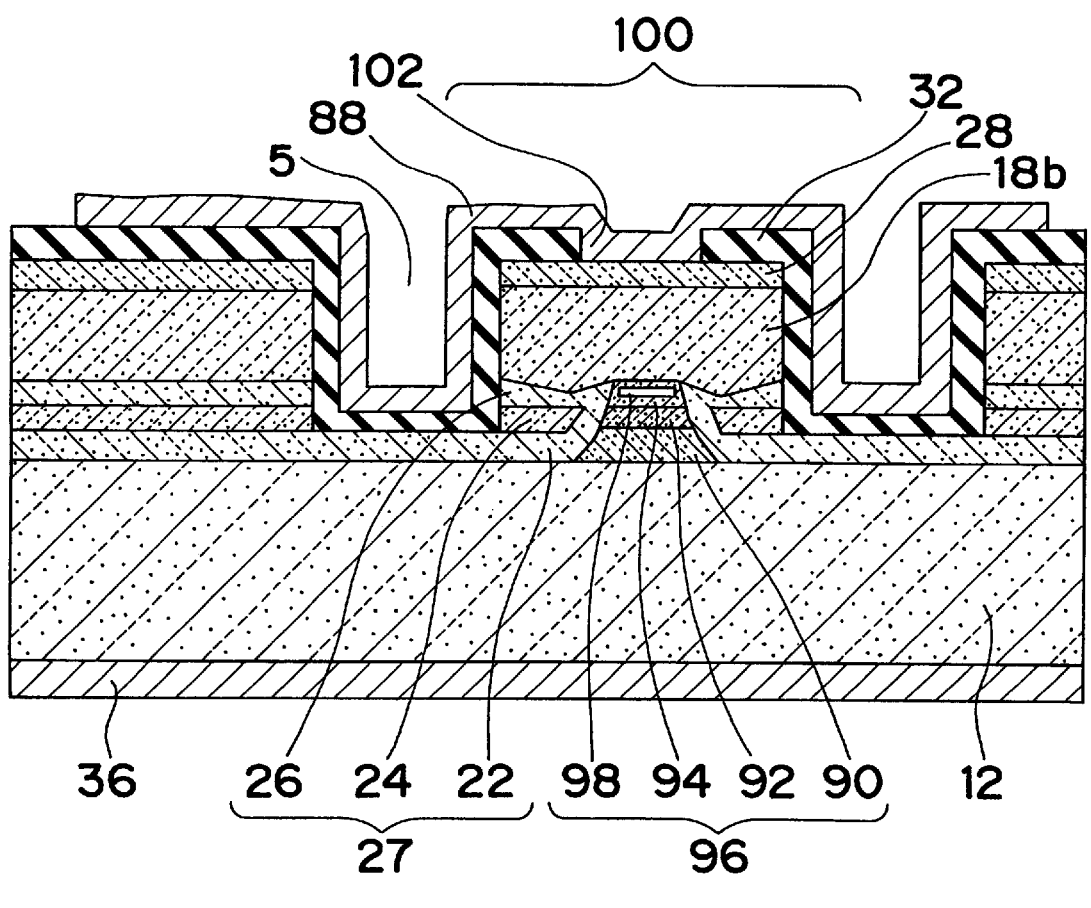
FIG. 9 is a schematic cross-sectional view taken along lines IX—IX in FIG. 8.
Figure 10:
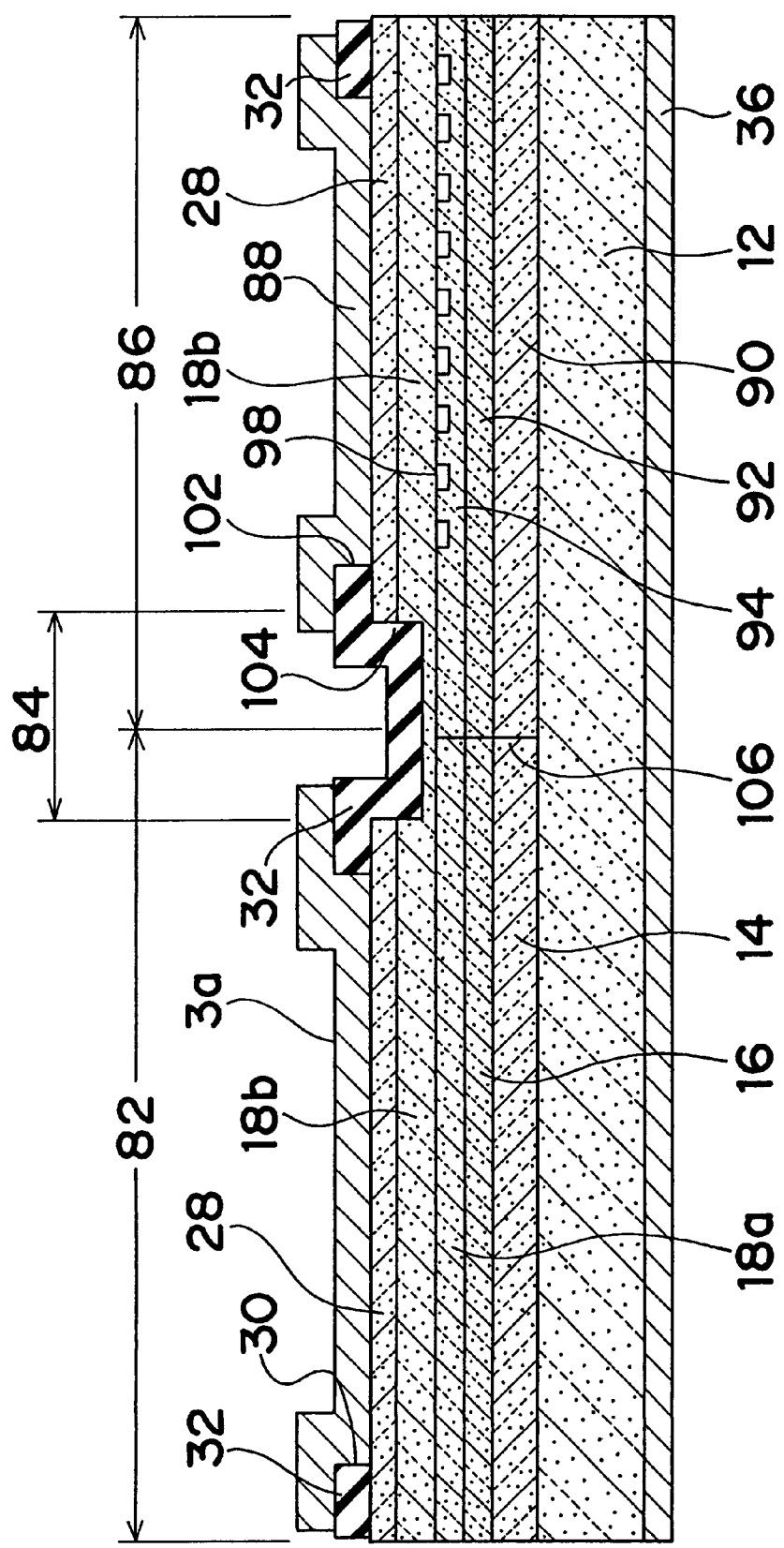
FIG. 10 is a schematic cross-sectional view taken along lines X—X in FIG. 8.
Figure 11:
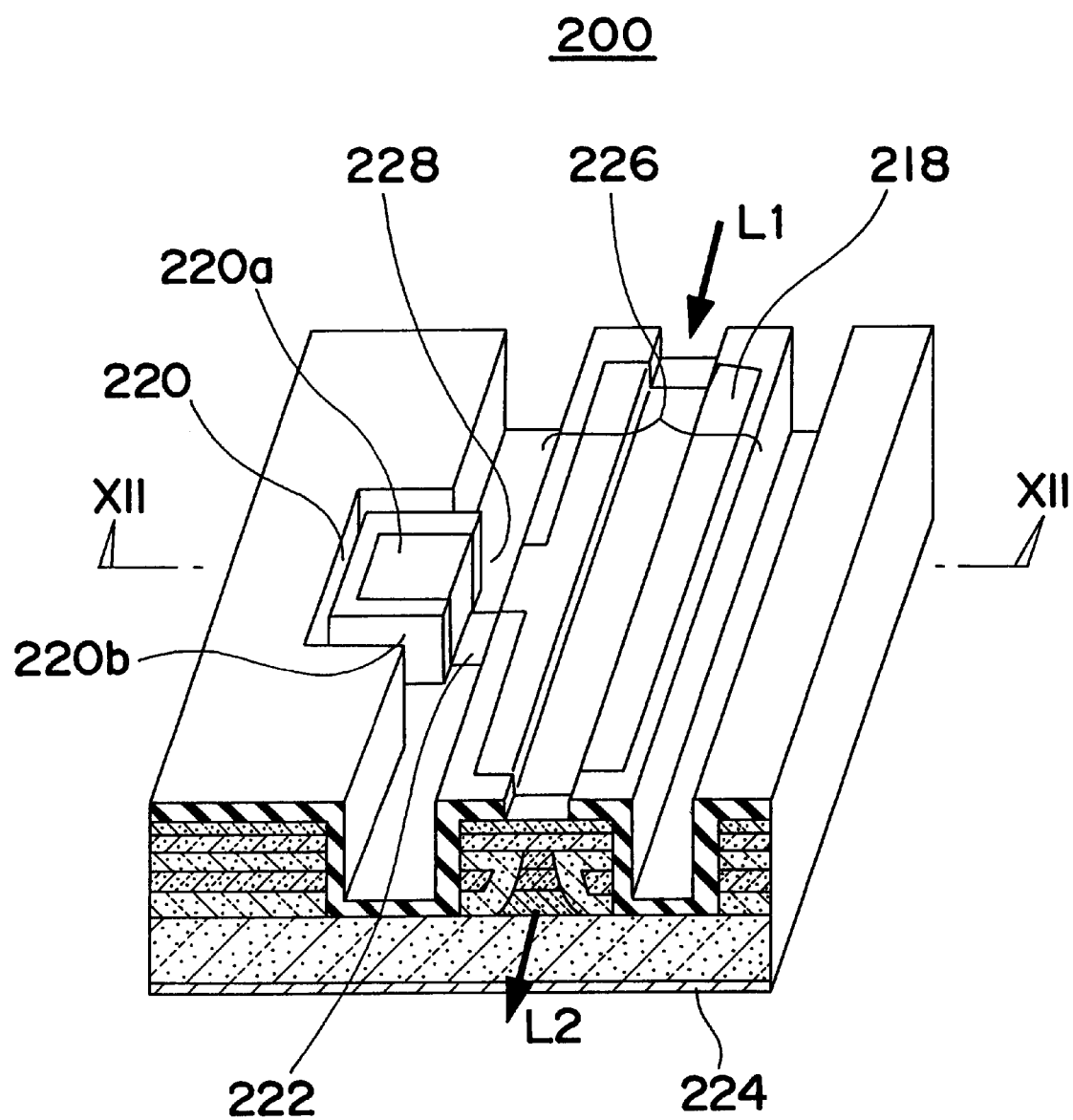
FIG. 11 is a schematic perspective view of the conventional modulator.
Figure 12:
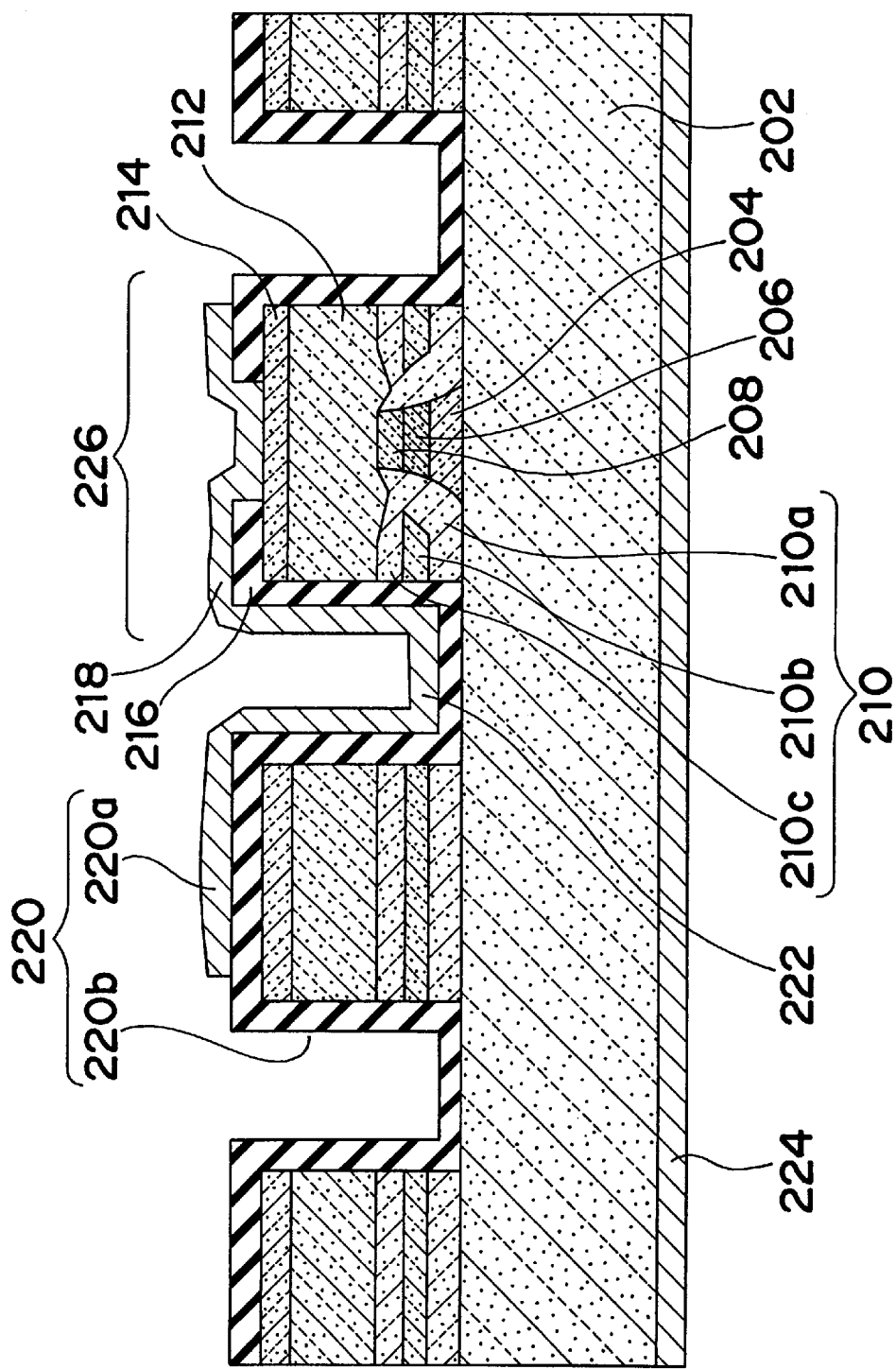
FIG. 12 is a schematic cross-sectional view taken along lines XII—XII in FIG. 11.

Referring now to FIGS. 8 to 10, a modulator-integrated semiconductor laser device 80 according to the fourth embodiment of the present invention is described hereinafter. FIG. 8 shows a schematic perspective view of a modulator-integrated semiconductor laser device 80, which is a device monolithically integrating the modulator 82 with a semiconductor laser device 86 on a common substrate 12.

With reference to the drawings, the semiconductor laser device 86 of the modulator-integrated semiconductor laser device 80 according to the fourth embodiment of the present invention is described hereinafter.

The semiconductor laser device 86 comprises the common substrate 12 and a common back electrode 36 formed on the lower major surface. The semiconductor laser device 86 further comprises a ridge-like laser waveguide 96 in the form of elongated ridge and the current blocking layer 27 similar to that of the modulator 82.

The ridge-like laser waveguide 96 includes a lower laser cladding layer 90 made of n-InP, an active layer 92, a first upper laser cladding layer 94 made of p-InP, and a diffraction grating layer 98 embedded in the first laser upper cladding layer 94, successively deposited on the substrate 12. The active layer 92 has an n-side beam confinement layer made of n-InGaAsP, a MQW layer made of InGaAsP, and a p-side beam confinement layer made of n-InGaAsP.

The current blocking layer 27 similar to that of the modulator 82 is deposited on the sides of the laser waveguide 96 and on the upper surface of the surface. The current blocking layer 27 is made by successively depositing the first lower embedded layer 22 made of InP doped with Fe, the hole-trapping layer 24 made of n-InP, and a second upper embedded layer 26 made of InP doped with Fe.

The semiconductor laser device 86 further comprises a second upper cladding layer 18b and the contact layer 28 successively formed on the ridge-like laser waveguide 96 and the second upper embedded layer 26, which are similar to those of the modulator 82.

The pair of channel portions 5 extending beyond the hole-trapping layer 24 and up to the first embedded layer 22 is formed longitudinally along the laser waveguide 96 and the current blocking layer 27 to form a ridge-like laser structure, centering the laser waveguide 96 therein.

The channel portion 5 is formed so that it extends to the hole-trapping layer 24 between the pad structure and the laser structure thereby to prevent the current from leaking.

Further, the insulating layer 32 of $SiO_2$ with an opening above the laser waveguide 96 and a laser electrode 88 electrically connected to the contact layer 28 through the opening are successively deposited on the laser structure to complete a semiconductor laser portion 86.

Referring to FIG. 10, by the butt-joint process, the modulator portion 82 and the semiconductor laser portion 86 are formed on the common substrate in close contact with each other through a composition face 106, so that the laser beam emitted from the semiconductor laser portion 86 can transmit through the modulator portion 82. The separating region 84 electrically isolates a contact layer 28 of the semiconductor laser portion 86 from that of the modulator portion 3 with a separating groove 104 and the insulating layer 32. The separating region 84 may cut the hole-trapping layer 24 between the semiconductor laser portion 86 and the modulator portion 3 unless the second embedded layer 26 is formed.

Although the diffraction grating layer 98 according to the present embodiment is embedded within the second upper cladding layer 18b along the laser waveguide 92, it may be embedded within the laser lower cladding layer 90 or the substrate 12.

Next, a process for manufacturing the modulator-integrated semiconductor laser device is described hereinafter.

By an epitaxial crystal growth according to a MOCVD process, the laser lower cladding layer 90 of n-InP, and the active layer 92 having the n-side beam confinement layer made of n-InGaAsP, a MQW layer made of InGaAsP and the p-side beam confinement layer made of n-InGaAsP are deposited in this order on the substrate 12. Further, the first laser upper cladding layer 94 of p-InP, a p-InGaAsP layer for forming the diffraction grating layer 98, and a cap layer made of p-InP are deposited thereon, successively.

A dielectric layer made of material such as $SiO_2$ and SiN with a stripe-like configuration is formed on the first upper cladding layer 94 and above the diffraction grating layer 98. With the use of the stripe-like dielectric layer as a mask, the resultant layers are etched until the substrate 12 is exposed.

Then, the butt-joint process using the stripe-like dielectric layer again grows, according to the MOCVD process, the lower cladding layer 14 made of n-InP, the beam absorption layer 16 made of undoped InGaAsP, and the first upper cladding layer 18a of p-InP of the modulator portion 82, successively.

Removing the stripe-like dielectric layer, by the interference exposure process or the electron beam exposure process, the InGaAsP layer is etched in the shape of grating to form a diffraction grating. Then the first upper cladding layer 94 made of p-InP is deposited on the resultant layer structure.

Again, an another stripe-like dielectric layer made of material such as $SiO_2$ and SiN with a width of 6 through 7 μm is laminated on the layer structures corresponding to the modulator portion 82 and the semiconductor laser portion 86.

The use of the HBr based etchant and the dielectric layer 40 as a mask allows the beam waveguide 20 and the laser waveguide 96 to be wet-etched to form a ridge-like configuration with the width of 1 to 2 μm.

Again with the use of the dielectric layer as a mask, the first embedded layer 22 of InP doped with Fe, the hole-trapping layer 24 of n-InP, and the second embedded layer 26 of InP doped with Fe are grown according to the MOCVD process on the opposite sides of the beam waveguide 20 and the waveguide 96 and on the substrate 12. In case where the current blocking layer 27 does not include the second embedded layer 26, the hole-trapping layer 24 in the separating region 84 between the modulator portion 82 and the semiconductor laser portion 86 is etched away in order to prevent a high frequency signal from leaking.

Then, the second upper cladding layer 18b made of p-InP and the contact layer 28 made of p⁺-InGaAs are successively deposited according to the MOVCVD process onto the resultant layer structure. The contact layer 28 and a part of the second upper cladding layer 18b are etched away to form the separating groove 104. Further, the contact layer 28 is etched to form the pair of channel portions 5, each of which extends beyond the hole-trapping layer 24 up to the first embedded layer 22, so that the modulator structure and the laser structure as well as the pad structure of the pad portion 4 are formed simultaneously.

The insulating layer 32 is laminated entirely on the resultant layer structure and then partially removed to form the opening 30 on the modulator portion and also the opening 102 on the semiconductor laser portion 86, through which the modulator electrode 3a and the semiconductor laser electrode 88 are connected with the contact layer 28, respectively. Each of the electrodes 3a and 88 comprises an Au plating layer coated on a Ti/Au layer. Lastly, the lower major surface of the substrate 12 is ground so that the substrate 12 has a thickness of approximately 100 $\mu$m, and the back electrode 36 is deposited thereon.

As described above, the laser waveguide 96 of the semiconductor laser portion 86 is formed and etched with the ridge configuration, and then the beam waveguide 20 of the modulator portion 82 is formed by the butt-joint process. However after the beam waveguide 20 of the modulator portion 82 is formed, the laser waveguide 96 of the semiconductor laser portion 86 may be formed by the butt-joint process.

Now the operation of the modulator-integrated semiconductor laser device 80 is described hereinafter. The forward-biased voltage applied between the laser electrode 88 and the back electrode 36 injects the current through the active layer 92, thereby emitting the laser beam, which is led to the modulator portion 82 via the separating region 84.

The reverse-biased voltage is applied between the modulator electrode 3a through the pad electrode 4a and the back electrode 36 so that the beam absorption index of the beam absorption layer 16 can be changed according to the Franz-Keldysh effect or the Stark quantum confinement effect.

Thus, while the reverse-biased voltage is not applied, the laser beam L2 is delivered. Contrary to this, the reverse-biased beam absorption layer 16 absorbs the laser beam and prevents the laser beam L2 from being delivered. This provides the ON-OFF switching of the laser beam according to the reverse-biased voltage, which can be a high-rate modulating electrical signal. Thus, the electrical signal can be transformed into the laser beam signal.

As described above, the cut-off frequency of the modulator 2 is dependent upon the CR time constant. In order to obtain a high-rate modulator for the high-density signal communication, the CR time constant, that is, the capacitance and/or the resistance of the modulator 2 should be reduced.

Focusing on the capacitance of the modulator 2, it equals to the sum of the capacitances of the modulator portion 3, the pad portion 4, and the channel portion 6. The capacitance of the pad portion 4 is dependent on the area thereof required for wire-bonding. Also, the capacitance of the modulator portion 3 is dependent on the width thereof required for well confining the beam and for readily manufacturing the device, and on the length thereof required for well absorbing the beam. The capacitance of the channel portion 5 is dependent on the thickness of the first embedded layer 22 and the insulating layer 32, as well as the area of the wire layer 6 defined by the wire width and the wire length between the modulator portion 3 and the pad portion 4, which is enough for preventing the modulator portion 3 from being damaged by wire-bonding on the pad portion 4. The capacitance of the modulator portion 5 is less than as would be unless the channel portion 5 divides the modulator portion 3 and the pad portion 4 since the contact layer 28 expands up to the pad portion 4.

In Embodiment 4, the channel portion 5 extends beyond the hole-trapping layer 24 and up to the first embedded layer 22. Thus, the capacitance of the channel portion 5 has the dielectric layer having the thickness that equals to the total thickness of not only the insulating layer 32 but also the first embedded semi-insulating semiconductor layer 22. This reduces the capacitance of the channel portion 5 and the capacitance of the modulator 2 to thereby increase the cut-off frequency of the modulator 2 so that the high-density signal communication is achieved with the use of the present modulator-integrated semiconductor laser device. In addition, the capacitance of the channel portion 5 may be reduced by narrowing the wire width of the wire layer 6.

Although the modulator-integrated semiconductor laser device 100 according to Embodiment 4 monolithically integrates the modulator 82 according to Embodiment 1 with the semiconductor laser device 86, another modulator-integrated semiconductor laser device may include another modulators 60, 70 as described in Embodiment 2 and 3 to achieve the same effect. In the case where the modulator 70 is integrated therewith, the semiconductor laser portion 86 may have the contact layer 18b with a certain width similar to that of the modulator portion 82.

In the above description, the modulator 82 and the semiconductor laser device 86 are monolithically integrated to form the modulator-integrated semiconductor laser device 100 according to Embodiment 4; however, the modulator according to any one of Embodiments 1 to 3 and an independent semiconductor laser device 86 may be mounted on an common substrate to allow the laser beam emitted from the semiconductor laser device to the modulator. This arrangement also realizes the high-rate signal communication.

PARTS LIST

3: MODULATOR PORTION
3a: MODULATOR ELECTRODE
4: PAD PORTION
4a: PAD ELECTRODE
4b: PAD BASE
5: CHANNEL PORTION
6: WIRE LAYER
12: SEMICONDUCTOR SUBSTRATE
16: BEAM ABSORPTION LAYER
20: BEAM WAVEGUIDE
22: FIRST EMBEDDED LAYER
24: HOLE-TRAPPING LAYER
26: SECOND EMBEDDED LAYER

27: CURRENT BLOCKING LAYER
32: INSULATING LAYER (SiO$_2$)
62: ETCHING-INHIBITING LAYER
72: CONTACT LAYER
86: SEMICONDUCTOR LASER PORTION
92: ACTIVE LAYER

What is claimed is:

1. A modulator, comprising:

a) a semiconductor substrate;

b) a ridge-like modulator structure formed on said semiconductor substrate for modulating a laser beam, said modulator structure including,
a ridge-like beam waveguide,
a current blocking layer disposed on opposite sides of the beam waveguide and said substrate, the current blocking layer having a first semi-insulating semiconductor layer and a first semiconductor layer successively formed on said substrate, and c) a pad structure formed on said semiconductor substrate and spaced away from said modulator structure via a channel portion having a bottom surface on the first semi-insulating semiconductor layer extending on said substrate from said modulator structure, for providing a wire-bonding pad base;

d) an insulating layer extending on said modulator structure, said pad structure, and the channel portion, said insulating layer having an opening on said modulator structure; and e) a wire layer disposed on said insulating layer, said wire layer being in contact with said modulator structure through the opening.

2. A modulator according to claim 1, wherein said current blocking layer further has a second semi-insulating semiconductor layer formed on said first semiconductor layer.

3. The modulator according to claim 1, wherein said pad structure includes a semi-insulating semiconductor layer and a semiconductor layer, similar to said current blocking layer.

4. The modulator according to claim 1, further comprising a second semiconductor layer interposed between said first semi-insulating semiconductor layer and said first semiconductor layer, wherein said second semiconductor layer is different in composition from said first semiconductor layer.

5. A modulator according to claim 1, wherein said modulator structure includes a stripe-like contact layer connected to said wire layer, said contact layer having an width narrower than that of said ridge-like modulator structure.

6. A modulator-integrated semiconductor laser device, comprising:

a) a semiconductor substrate;

b) a ridge-like modulator structure formed on said semiconductor substrate for modulating a laser beam, said modulator portion including,
a ridge-like beam waveguide, and
a current blocking layer disposed on opposite sides of the beam waveguide and said substrate, the current blocking layer having a first semi-insulating semiconductor layer and a first semiconductor layer successively formed on said substrate;

c) a pad structure formed on said semiconductor substrate and spaced away from said modulator structure via a channel portion having a bottom surface on the first semi-insulating semiconductor layer extending on said substrate from said modulator structure, for providing a wire-bonding pad base;

d) an insulating layer disposed on said modulator structure, said pad structure, and the channel portion, said insulating layer having an opening on said modulator structure;

e) a wire layer disposed on said insulating layer, said wire layer being in contact with said modulator structure through the opening; and f) a semiconductor laser structure disposed on said substrate and adjacent to said modulator structure in a longitudinal direction thereof, said semiconductor laser structure including an active layer optically connected to said beam absorption layer.

7. A modulator-integrated semiconductor laser device according to claim 6, wherein said current blocking layer further has a second semi-insulating semiconductor layer formed on said first semiconductor layer.

8. The integrated semiconductor device according to claim 6, wherein said pad structure includes a semi-insulating semiconductor layer and a semiconductor layer, similar to said current blocking layer.

9. The integrated semiconductor device according to claim 6, further comprising a second semiconductor layer interposed between said first semi-insulating semiconductor layer and said first semiconductor layer, wherein said second semiconductor layer is different in composition from said first semiconductor layer.

10. A modulator-integrated semiconductor laser device according to claim 6, wherein said modulator structure includes a stripe-like contact layer connected to said wire layer, said contact layer having an width narrower than that of said ridge-like modulator structure.

* * * * *